(12) United States Patent
Sato et al.

(10) Patent No.: US 7,883,789 B2
(45) Date of Patent: *Feb. 8, 2011

(54) SUBSTRATE WITH TRANSPARENT CONDUCTIVE OXIDE FILM, PROCESS FOR ITS PRODUCTION AND PHOTOELECTRIC CONVERSION ELEMENT

(75) Inventors: Kazuo Sato, Chiyoda-ku (JP); Junichi Sato, legal representative, Yokohama (JP); Naoki Taneda, Yokohama (JP); Makoto Fukawa, Yokohama (JP); Nobutaka Aomine, Yokohama (JP); Mika Kambe, Yokohama (JP); Yukio Yoshikawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 408 days.

This patent is subject to a terminal disclaimer.

(21) Appl. No.: 11/951,137

(22) Filed: Dec. 5, 2007

(65) Prior Publication Data

US 2008/0152868 A1     Jun. 26, 2008

Related U.S. Application Data

(60) Division of application No. 11/395,185, filed on Apr. 3, 2006, now Pat. No. 7,364,808, which is a division of application No. 10/826,290, filed on Apr. 19, 2004, now Pat. No. 7,179,527, which is a continuation of application No. PCT/JP02/10801, filed on Oct. 17, 2002.

(30) Foreign Application Priority Data

Oct. 19, 2001   (JP) .............................. 2001-322552

(51) Int. Cl.
*B32B 19/00*   (2006.01)

(52) U.S. Cl. .................. 428/702; 428/689; 136/256
(58) Field of Classification Search .............. 136/256; 427/584–585, 255.31–255.36, 267, 126.3; 428/702, 689

See application file for complete search history.

(56) References Cited

U.S. PATENT DOCUMENTS 4,532,537 A     7/1985   Kane (Continued)

FOREIGN PATENT DOCUMENTS

EP     0 234 222 A2    9/1987

(Continued)

OTHER PUBLICATIONS

Hegedus S. et al: "Effect of textured tin oxide and zin oxide substrates on the current generation in amorphous silicon solar cells" Conference Record of Twenty Fifth IEEE Photovoltaic Specialists Conference—May 13, 1996, pp. 1129-1132.

*Primary Examiner*—Jeffrey T Barton
(74) *Attorney, Agent, or Firm*—Oblon, Spivak, McClelland, Maier & Neustadt, L.L.P.

(57) ABSTRACT

A substrate with a transparent conductive oxide film (especially a substrate with a transparent conductive oxide film useful as a substrate for a thin-film silicon-based solar cell) being excellent in mass production efficiency and being characterized by having a low resistance, a high transparency and a good light scattering performance over a full wavelength region (300 nm to 3 µm) of solar ray, a process for its production, and a photoelectric conversion element (especially, solar cell) employing the substrate, are presented. A substrate with a transparent conductive oxide film, comprising a substrate and a transparent conductive oxide layer formed on the substrate and constituted by a plurality of ridges and a plurality of flat portions, wherein the surfaces of the ridges and the flat portions, have many continuous micron-size protrusions.

13 Claims, 7 Drawing Sheets

U.S. PATENT DOCUMENTS

| | | |
|---|---|---|
| 4,599,482 A | 7/1986 | Yamazaki |
| 4,694,116 A | 9/1987 | Hayashit et al. |
| 5,395,740 A | 3/1995 | Swirbel et al. |
| 5,977,477 A | 11/1999 | Shiozaki |
| 5,999,157 A | 12/1999 | Ito et al. |
| 6,072,117 A | 6/2000 | Matsuyama et al. |
| 6,750,394 B2 | 6/2004 | Yamamoto et al. |
| 6,787,692 B2 | 9/2004 | Wada et al. |
| 6,825,408 B2 | 11/2004 | Nagano et al. |
| 2005/0000564 A1 | 1/2005 | Sato et al. |

FOREIGN PATENT DOCUMENTS

| | | |
|---|---|---|
| EP | 0 827 212 A2 | 3/1998 |
| EP | 1 056 136 A1 | 11/2000 |
| JP | 61-288314 | 12/1986 |
| JP | 61-288473 | 12/1986 |
| JP | 1-132004 | 5/1989 |
| JP | 2-168507 | 6/1990 |
| JP | 3-125481 | 5/1991 |
| JP | 5-67797 | 3/1993 |
| JP | 5-75153 | 3/1993 |
| JP | 6-12840 | 2/1994 |
| JP | 7-105166 | 11/1995 |
| JP | 8-78714 | 3/1996 |
| JP | 9-139515 | 5/1997 |
| JP | 9-293892 | 11/1997 |
| JP | 10-70294 A | 3/1998 |
| JP | 2000-232234 | 8/2000 |
| JP | 2000-252500 | 9/2000 |
| JP | 2001-085722 A | 3/2001 |
| JP | 2001-176334 | 6/2001 |
| JP | 2001-176334 A | 6/2001 |
| WO | WO 88/09265 | 12/1988 |
| WO | WO 00/28603 | 5/2000 |

SOLAR RAY

A

B

A

1 μm

B

10 μm

A                B

SUBSTRATE WITH TRANSPARENT CONDUCTIVE OXIDE FILM, PROCESS FOR ITS PRODUCTION AND PHOTOELECTRIC CONVERSION ELEMENT

This application is a Divisional Application of Ser. No. 11/395,185 filed Apr. 3, 2006, which is a DIV of Ser. No. 10/826,290 filed Apr. 19, 2004, which is a CON of PCT/JP02/10801 filed Oct. 17, 2002 and claims priority to Japanese Application 2001-322552 filed Oct. 19, 2001.

TECHNICAL FIELD

The present invention relates to a substrate with a transparent conductive oxide film, a process for its production and a photoelectric conversion element (especially a solar cell) employing the substrate.

BACKGROUND ART

Thin-film solar cells being photoelectric conversion elements may, for example, be of an amorphous silicon (a-Si) type or a polycrystalline silicon type. In such thin-film silicon type solar cells, a transparent conductive oxide film is used as an incident light side electrode. Such a transparent conductive oxide film is required to have a low resistance and high transparency and to have a high light scattering performance in order to increase the photoelectric conversion efficiency. JP-B-7-105166 discloses a fluorine-doped $SnO_2$ film which contains fluorine in an amount of from 0.01 to 4 mol % based on $SnO_2$ and which has a conductive electron density of from $5 \times 10^{19}$ to $4 \times 10^{20}$ cm$^{-3}$, and the film has a low absorbance, is highly transparent and further has high durability against an active hydrogen species.

JP-B-6-12840 discloses a transparent conductive film which has a surface roughness (texture) structure and has an effect to scatter incident light within a photoelectric conversion unit, whereby as compared with a transparent conductive film having a small surface roughness, the photoelectric conversion efficiency of an amorphous silicon solar cell can be made high.

On the other hand, in the case of a thin-film crystalline silicon solar cell such as a thin film polycrystalline silicon or a thin-film microcrystalline silicon which has been actively studied in recent years, the cell sensitivity in a long wavelength region is high as compared with an amorphous silicon solar cell. This indicates that as compared with an amorphous silicon type, a light scattering property and a high transparency in a longer wavelength region, are required for the transparent conductive film. In order to increase light scattering at a long wavelength, it is effective to further increase the surface roughness structure of the transparent conductive film. For example, if the film thickness is made thick, the crystal grain size will be increased, whereby the surface roughness can be increased. However, a transparent conductive film such as a fluorine-doped $SnO_2$ film has light absorption in a long wavelength region by free electrons, whereby if the film is made thick, the light absorption increases, whereby the optical transmittance decreases. Consequently, even if light scattering on a long wavelength side is increased by increasing the surface roughness, light absorption of a long wavelength will also increase, whereby as a whole, the photoelectric conversion efficiency of the solar cell will not increase, and it has been difficult to increase the efficiency of the photoelectric conversion by means of a transparent conductive film having a high spectral haze value (which may hereinafter be referred to simply as "a haze").

Other than the above, a technique to increase the light scattering effect by controlling the surface roughness of a transparent conductive film in contact with the photoelectric conversion layer, has heretofore been well known and is disclosed in e.g. JP-A-3-125481, JP-A-2000-252500, JP-A-61-288314, JP-A-61-288473, JP-A-61-288314 or JP-A-2000-232234.

In JP-A-3-125481 among them, a transparent electrode substrate is disclosed which is characterized by a structure wherein a first layer having a large average particle size and a second layer having a small average particle size are laminated. This is designed to refract and scatter light with a long wavelength by the first layer having a large average particle size and light with a short wavelength by the second layer having a small average particle size, in order to let more light be absorbed by the photoelectric conversion layer. However, with the electrode structure disclosed in Examples, both the first and second layers are transparent conductive films, whereby absorption by free electrons can not be avoided. Namely, incident light will pass through the first layer film of at least 1.0 μm over the entire region of the substrate surface and will further pass through the second layer film of at least 0.2 μm, whereby as a whole, absorption by films of at least 1.2 μm will take place. Accordingly, attenuation of light before reaching the photoelectric conversion layer can not be avoided. Thus, it has been found that with the construction of the substrate as disclosed in JP-A-3-125481, no significant improvement can be obtained in the photoelectric conversion efficiency.

Further, JP-A-2000-252500 also discloses a transparent electrode substrate for a silicon thin-film type photoelectric conversion device, wherein a first transparent conductive film having a large difference in the surface roughness, is formed on a glass substrate, and a second transparent conductive film having a small difference in the surface roughness, is formed thereon. It is stated that by reducing the difference in roughness of the second transparent conductive film to make the surface smooth, spike-like protrusions can be eliminated, whereby short circuiting of junctions in the photoelectric conversion unit can be reduced, and thus fluctuation of the performance of the photoelectric conversion device can be reduced. However, it has been found that also this transparent electrode substrate has a drawback that, like the above-mentioned problem, as light will pass through absorptive two layers of transparent conductive films (continuous films), the amount of incident light to the photoelectric conversion layer will be reduced by an amount absorbed by the conductive films, whereby the photoelectric conversion efficiency will not be improved.

Further, JP-A-61-288314 and JP-A-61-288473 disclose that with a transparent electrode film represented by indium/tin oxide or $SnO_2$ formed by a conventional electron beam vapor deposition method, a vacuum vapor deposition method, a sputtering method, a CVD method or a spray method, the difference in the surface roughness is from about 20 to 100 nm, and the distance between protrusions is from about 50 to 200 nm, whereby the light scattering effect at the interface with the photoelectric conversion layer is inadequate. Whereas, it is disclosed possible to increase the light scattering effect at the interface and to increase the photoelectric conversion efficiency by carrying out chemical etching treatment of the transparent electrode film surface to form a roughened surface having a difference in roughness of from about 100 to 500 nm and a distance between protrusions of from about 200 to 1000 nm. However, this system requires to carry out chemical etching treatment after forming the transparent electrode films and to sufficiently clean and dry the substrate in order to remove the etching solution and then to form the photoelectric conversion layer, whereby the process tends to be cumbersome, and there is a problem that the productivity is low.

Further, JP-A-2000-232234 discloses that a photoelectric conversion device having a transparent electrode wherein the difference in surface roughness is from 10 to 100 nm and the pitch of surface roughness is larger than the difference in the surface roughness and not larger than 25 times thereof, will have the photoelectric conversion characteristics improved by a light-trapping effect, without bringing about a decrease of an open circuit voltage or a decrease of the production yield. However, the means to realize the surface roughness in this process is chemical etching like in the above-mentioned cases, whereby the process tends to be cumbersome, and there will be a problem in mass production.

The present invention has been made to solve such problems of the prior art. It is an object of the present invention to provide a substrate with a transparent conductive oxide film (especially a substrate with a transparent conductive oxide film useful as a substrate for a thin film silicon type solar cell) which has a low resistance, a high transparency and a characteristic of having a good light scattering performance over a full wavelength region (from 300 nm to 3 μm) of solar ray and which is excellent in mass productivity, a process for its production, and a photoelectric conversion element (especially a solar cell) employing such a substrate,

DISCLOSURE OF THE INVENTION

The above object can be accomplished by using such a substrate with a transparent conductive oxide film provided by the present invention. Namely, the present invention has the following gists.

(1) A substrate with a transparent conductive oxide film, comprising a substrate and a transparent conductive oxide film provided on the substrate and constituted by a plurality of ridges and a plurality of flat portions, wherein the surfaces of the ridges and the flat portions have many continuous micron-size protrusions.

The heights of the ridges are preferably from 0.2 to 2.0 μm and the pitches between the ridges (the distances between the tops of adjacent ridges) are linearly preferably from 0.1 to 2.0 μm.

(2) The substrate with a transparent conductive oxide film according to the above (1), wherein the protrusions have basal plane diameters of from 0.1 to 0.3 μm and height/basal plane diameter ratios of from 0.7 to 1.2.

(3) A substrate with a transparent conductive oxide film, comprising a substrate and a transparent conductive oxide film provided on the substrate, wherein the substrate with the transparent conductive oxide film, has a haze of from 10 to 95% over a full wavelength region of from 400 to 800 nm, and the difference of the absolute values between the maximum value and the minimum value of the haze (the maximum value–the minimum value) is not more than 50%.

(4) The substrate with a transparent conductive oxide film according to the above (3), wherein the substrate with the transparent conductive oxide film, has a haze of from 40 to 70% (as an average of from 400 to 600 nm) in a wavelength region of from 400 to 600 nm and a haze of from 20 to 40% (as an average of from 600 to 800 nm) in a wavelength region of from 600 to 800 nm.

(5) A substrate with a transparent conductive oxide film, comprising a substrate and a transparent conductive oxide film provided on the substrate, wherein the transparent conductive oxide film comprises discontinuous small ridges made of a first oxide and a continuous layer made of a second oxide, formed on the small ridges, wherein the surface of the continuous layer has many continuous micron-size protrusions.

(6) The substrate with a transparent conductive oxide film according to any one of the above (1) to (5), wherein the substrate with the transparent conductive oxide film, has a sheet resistance of from 8 to 20Ω/□ and an optical transmittance of from 80 to 90% at 550 nm measured by an immersion liquid method.

(7) The substrate with a transparent conductive oxide film according to the above (5), wherein the small ridges have basal plane diameters of from 0.2 to 2.0 μm.

The first oxide is preferably transparent.

(8) The substrate with a transparent conductive oxide film according to the above (5), wherein the first oxide is composed of $SnO_2$ or $SnO_2$ containing fluorine, the fluorine content being not more than 0.01 mol % based on $SnO_2$.

The second oxide is preferably transparent.

The second oxide preferably has electrical conductivity.

(9) The substrate with a transparent conductive oxide film according to any one of the above (5) to (8), wherein the second oxide is a transparent conductive oxide containing at least one member selected from the group consisting of $SnO_2$, ZnO and $In_2O_3$.

(10) The substrate with a transparent conductive oxide film according to any one of the above (5) to (9), wherein the second oxide is $SnO_2$ containing fluorine-doped tin as the main component, contains fluorine in an amount of from 0.01 to 4 mol % based on $SnO_2$ and has a conductive electron density of from $5\times10^{19}$ to $4\times10^{20}$ $cm^{-3}$.

(11) The substrate with a transparent conductive oxide film according to any one of the above (5) to (10), wherein a film made of an oxide different in the composition from the first and second oxides, is formed between the discontinuous small ridges made of the first oxide and the continuous layer made of the second oxide.

(12) The substrate with a transparent conductive oxide film according to the above (11), wherein the first oxide is $SnO_2$, the different oxide is $SiO_2$, and the second oxide is fluorine-doped $SnO_2$.

(13) The substrate with a transparent conductive oxide film according to the above (1), (2), (5), (6), (7), (8), (9), (10), (11) or (12), wherein the substrate with the transparent conductive oxide film, has a haze of from 10 to 95% over a full wavelength region of from 400 to 800 nm.

(14) A process for producing the substrate with the transparent conductive oxide film as defined in any one of the above (1) to (13), which comprises forming, on a transparent substrate, discontinuous small ridges made of a first oxide by an atmospheric pressure CVD method, and forming thereon a continuous layer made of a second oxide.

(15) The process for producing the substrate with the transparent conductive oxide film according to the above (14), wherein the small ridges are formed by an atmospheric pressure CVD method employing tin tetrachloride, water and hydrogen chloride.

(16) The process for producing the substrate with the transparent conductive oxide film according to the above (14), wherein the continuous layer made of the second oxide is formed on the discontinuous small ridges made of the first oxide, by an atmospheric pressure CVD method.

(17) The process for producing the substrate with the transparent conductive oxide film according to the above (16), wherein a film made of an oxide different in the composition from the first and second oxides, is formed between the discontinuous small ridges made of the first oxide and the continuous layer made of the second oxide, by an atmospheric pressure CVD method.

(18) A photoelectric conversion element having a rear face electrode, via a photoelectric conversion layer, on the substrate with the transparent conductive oxide film as defined in any one of the above (1) to (13).

(19) The photoelectric conversion element according to the above (18), wherein the photoelectric conversion layer is a layer having p-, i- and n-type-layers formed in this order.

(20) The photoelectric conversion element according to the above (18), wherein the rear face electrode is a metal film containing Ag in an amount of at least 95 mol % in the film.

(21) The photoelectric conversion element according to the above (20), wherein the metal film contains Pd or Au in an amount of from 0.3 to 5 mol % in the film.

(22) The photoelectric conversion element according to any one of the above (18) to (21), which has a contact-improving layer between the rear face electrode and the n-type-layer nearest to the rear face electrode, between the photoelectric conversion layer and the rear face electrode.

(23) The photoelectric conversion element according to the above (22), wherein the contact-improving layer has a resistivity of not more than $1 \times 10^{-2}$ Ω·cm.

(24) The photoelectric conversion element according to the above (22) or (23), wherein the contact-improving layer has an absorption coefficient of not more than $5 \times 10^3$ cm$^{-1}$ in a wavelength region of from 500 to 800 nm.

(25) The photoelectric conversion element according to any one of the above (22) to (24), wherein the contact-improving layer Contains zinc oxide (ZnO) as the main component, and at least 90 atomic % of the total metal component in the layer is Zn.

(26) The photoelectric conversion element according to the above (25), wherein the layer containing ZnO as the main component, contains Ga or Al in an amount of from 0.3 to 10 mol % based on the summation with Zn.

The above contact-improving layer is preferably formed by a sputtering method which is carried out in an inert gas containing carbon dioxide in an amount of from 0.3 to 20 vol %.

Film-forming by such a sputtering method is preferably carried out by having the target inclined at an angle of from 30 to 90° to the substrate.

MEANINGS OF SYMBOLS

| | |
|---|---|
| 1: glass substrate | 2: ridge |
| 3: flat portion | 4: small ridge |
| 5: continuous layer | 10: protrusion |
| $W_a$: distance between ridges | |
| $W_c$: distance between small ridges | |
| $H_a$: height of ridge | $H_b$: height of protrusion |
| $H_c$: height of small ridge | |
| $H_d$, $H_e$: thickness of continuous layer | |
| $D_a$: basal plane diameter of ridge | |
| $D_b$: basal plane diameter of protrusion | |
| $D_c$: basal plane diameter of small ridge | |
| $P_a$: pitch between ridges | |
| $P_b$: pitch between protrusions | |
| $P_c$: pitch between small ridges | |
| 20: solar cell | 21: transparent insulating substrate |
| 22: transparent conductive film | 23: p-type-layer |
| 24: i-type-layer | 25: n-type-layer |
| 26: photoelectric conversion layer | |
| 27: rear face electrode | |
| 28: light | 29: conductor wire |
| 40: substrate for solar cell | |
| 41: contact-improving layer | |
| 42: p-i-n-type-layer of a-Si | |
| 43: rear face electrode | 44: glass substrate |
| 45: transparent conductive oxide film | |

BEST MODE FOR CARRYING OUT THE INVENTION

Now, the present invention will be described in detail.

The shape and construction of the substrate with a transparent conductive oxide film of the present invention will be described with reference to FIGS. 1 and 2. However, the substrate with a transparent conductive oxide film of the present invention, the process for its production and the photoelectric conversion device (hereinafter a specific example of a solar cell will be described) are not limited thereto.

Figure 1:
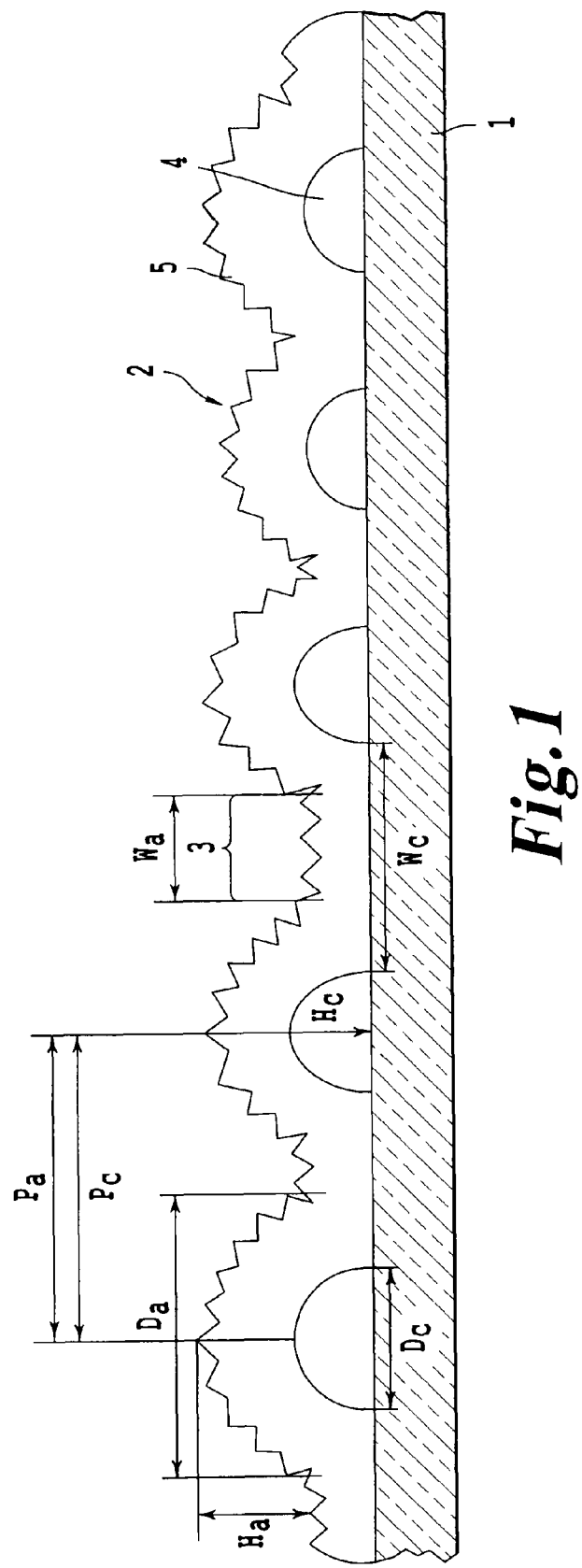
FIG. 1 is a partly omitted cross-sectional view showing the shape and construction of the substrate with a transparent conductive oxide film of the present invention.

As shown in FIG. 1, the substrate with a transparent conductive oxide film of the present invention has, on a glass substrate 1, macro-sized roughness (texture) formed by a plurality of discontinuous ridges 2 and a plurality of flat portions 3 filling gaps between such ridges, and has a structure wherein the outer surfaces of the ridges 2 and the flat portions 3 have microroughness (texture). Hereinafter, the structure having two roughnesses as described above, will be referred to as a double texture structure.

The height $H_a$ of the ridge (the height from the top of the micron-size protrusions on the flat portions) is preferably from 0.2 to 2.0 μm, more preferably from 0.3 to 1.0 μm, further preferably from 0.4 to 0.7 μm. The spacing $W_a$ between the ridges (the distance of the flat portion between the adjacent ridges) is linearly preferably from 0 to 2.0 μm, more preferably at most 1.2 μm, further preferably at most 0.4 μm, particularly preferably at least 0.1 μm (every ridge is discontinuous). In the present invention, the plurality of ridges may have a discontinuous portion and a continuous portion, and the spacing $W_a$ between ridges being from 0 to 2.0 μm, means that there may be a portion where no flat portion is present.

Further, the basal plane diameter $D_a$ of the above ridge is preferably from 1.0 to 3.0 µm, more preferably from 1.0 to 2.0 µm.

Further, the pitch $P_a$ between the above ridges (the distance between the tops of the adjacent ridges) is linearly preferably from 0.1 to 2.0 µm, more preferably from 0.5 to 1.5 µm, further preferably from 0.7 to 1.2 µm.

Figure 2:
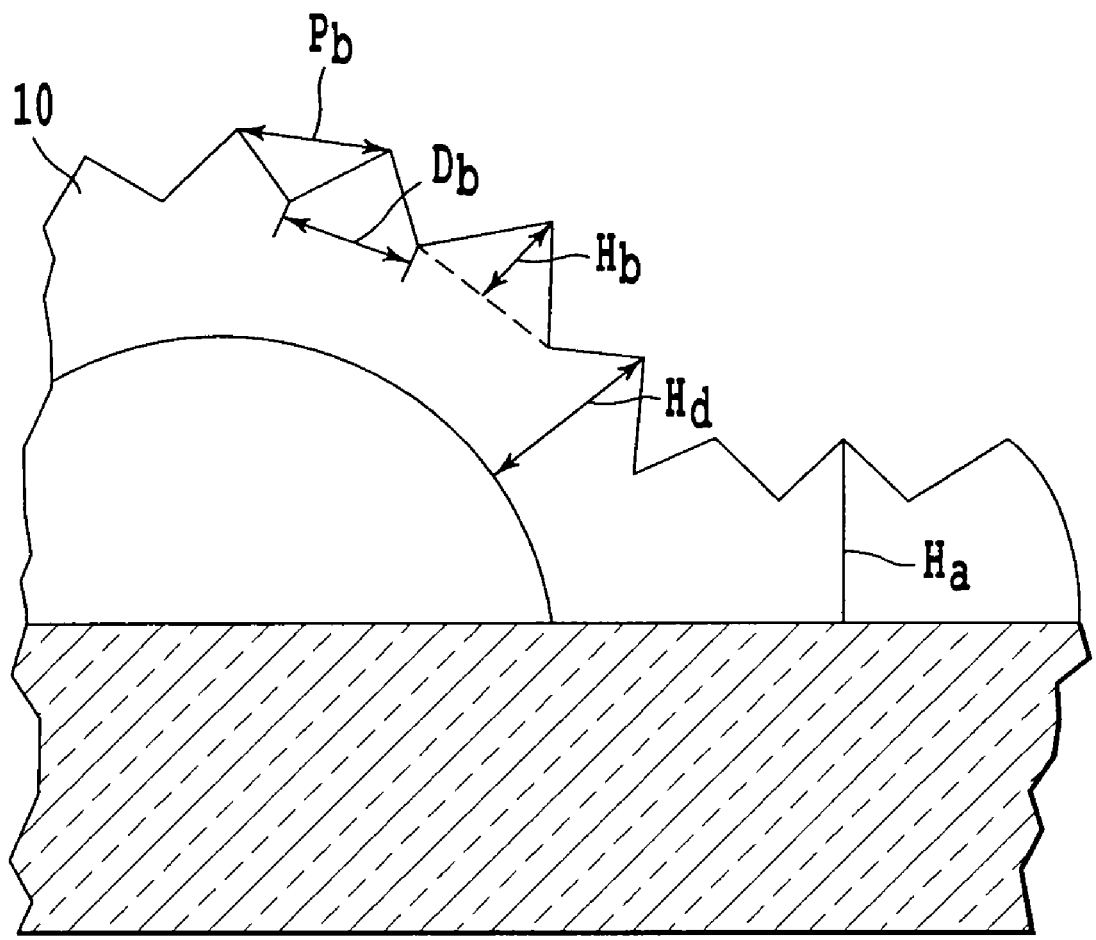
FIG. 2 is an enlarged view of a ridge shown in FIG. 1.

An enlarged view of FIG. 1 showing the above-mentioned microroughness, is shown in FIG. 2. As shown in FIG. 2, the height $H_b$ of a protrusion 10 is preferably from 0.05 to 0.2 µm, more preferably from 0.1 to 0.2 µm. Further, the pitch $P_b$ between the protrusions (the distance between the tops of the adjacent protrusions) is linearly preferably from 0.1 to 0.3 µm, more preferably from 0.1 to 0.2 µm.

Further, the basal plane diameter $D_b$ of the above protrusion 10 is preferably from 0.1 to 0.3 µm, more preferably from 0.15 to 0.3 µm, and the ratio of height $H_b$/basal plane diameter $D_b$ of the protrusion 10 is preferably from 0.7 to 1.2, more preferably from 0.7 to 1.0.

By making the outer surfaces of the ridges 2 and the flat portions 3 to have roughness (microroughness) smaller than the roughness (macro-sized roughness) of such ridges, it is possible to intensely scatter light with a short wavelength, whereby it becomes possible to effectively scatter light in a wide wavelength range as a whole. Namely, it is possible to scatter light with a long wavelength by ridges having large roughness and to scatter light with a short wavelength by the surface with small roughness.

Further, by virtue of the above-mentioned double texture structure, the substrate with a transparent conductive oxide film of the present invention has the following relation between the wavelength and the haze over the entire substrate. Namely, over a full wavelength region of from 400 to 800 nm, the haze is from 10 to 95%. The haze is preferably from 40 to 70% in a wavelength region of from 400 to 600 nm, particularly preferably from 20 to 40% in a wavelength region of from 600 to 800 nm. Further, the difference between the maximum value and the minimum value of the haze (the maximum value–the minimum value) is preferably not more than 50%.

A substrate to be used as the substrate with a transparent conductive oxide film of the present invention is not necessarily required to be flat and a plate-shaped, and it may have a curved surface or an abnormal profile. Such a substrate may, for example, be a glass substrate, a ceramic substrate, a plastic substrate or a metal substrate. The substrate is preferably a transparent substrate excellent in optical transmittance, and it is preferably a glass substrate from the viewpoint of the strength and heat resistance. As such a glass substrate, a transparent glass plate made of colorless transparent soda lime silicate glass, aluminosilicate glass, borate glass, lithium aluminosilicate glass, quartz glass, borosilicate glass substrate, no-alkali glass substrate or various other glass, may be employed.

When it is used as a substrate for a solar cell, the glass substrate preferably has a thickness of from 0.2 to 6.0 mm. Within this range, the glass substrate has high strength and high optical transmittance. Further, the substrate preferably has a high optical transmittance, for example, an optical transmittance of at least 80%, in a wavelength region of from 350 to 800 nm. Further, it preferably has a sufficient insulating property and high chemical and physical durability.

Further, in the case of a glass substrate made of glass containing sodium such as soda lime silicate glass, or a glass substrate made of a low alkali-containing glass, in order to minimize diffusion of an alkali component from the glass to a transparent conductive film formed thereon, an alkali barrier layer such as a silicon oxide film, an aluminum oxide film or a zirconium oxide film, may be formed on the glass substrate surface.

Further, on the surface of the glass substrate, a layer to reduce the difference in the refractive index between the surface of the glass substrate and the layer formed thereon, may further be formed.

The alkali barrier layer to be formed on a soda lime glass substrate may, for example, be $SiO_2$, or a mixed oxide film or a multilayer film of $SiO_2$ and $SnO_2$, and the film thickness is preferably from 20 to 100 nm. If the film thickness is within this range, it is possible to control absorption and reflection of a transmitted light from the glass substrate. As an example of the multilayer film, a film may be mentioned wherein a $SnO_2$ film and a $SiO_2$ film are sequentially deposited on a soda lime glass substrate, and the film thicknesses are preferably from 20 to 30 nm and from 20 to 40 nm, respectively. Especially, the thickness of the alkali barrier layer is preferably from 40 to 60 nm.

With respect to measurement of the surface condition, the microroughness formed on the outer surface can be measured by the following methods.

(1) Analysis of the Surface Profile

Protrusions on the film surface were observed by a scanning electron microscope (SEM), and from the obtained microscopic photograph, the basal plane diameters of the protrusions were measured. Further, the surface morphology of the film was observed by SEM and by an atomic force microscope (AFM), and from the obtained microscopic photograph, the surface morphology of the film and the heights of the protrusions were analyzed.

(2) Measurement of the Surface Coverage

The coverage on the substrate by small ridges made of the first oxide was measured from the SEM photograph. A value obtained by dividing the area occupied by small ridges on the substrate by the area of the entire covered surface of the substrate was evaluated as the surface coverage.

The substrate with a transparent conductive oxide film of the present invention may be such that a transparent conductive oxide film having the above-mentioned double texture structure may be formed on a transparent substrate, and the above structure may be formed by a single oxide, but preferably it is constituted by the first and second oxides which will be described hereinafter.

The shape of the substrate with a transparent conductive oxide film of the present invention comprises the above ridges 2 and the flat portions 3, as shown in FIG. 1, and its construction is preferably such that the ridges 2 and the flat portions 3 are formed by discontinuous small ridges 4 made of the first oxide formed on a glass substrate 1 and a continuous layer S made of a second oxide 2, formed thereon.

Now, a preferred embodiment employing an atmospheric pressure CVD method, of the process for producing the substrate with a transparent conductive oxide film of the present invention, will be described, but the process of the present invention is not limited thereto.

A soda lime glass substrate is heated to 500° C. in a belt conveyor furnace, and on this glass substrate, 4 L/min of nitrogen gas containing 5 mol % of silane gas and 20 L/min of oxygen gas are simultaneously blown to form a silica film. Then, this glass substrate with a silica film is heated to 540° C., and tin tetrachloride, water and hydrogen chloride gas are simultaneously blown to form discontinuous small ridges made of a first oxide on the silica film.

The surface coverage of the discontinuous small ridges made of the first oxide on the glass substrate is from 10 to 70%, and if the surface coverage is within this range, the haze will be from 10 to 95% over a full wavelength region of from 400 to 800 nm, such being preferred. Further, such surface coverage is preferably from 50 to 60%, and if the surface coverage is within this range, after formation of the second oxide, the haze will be from 40 to 70% (as an average of from 400 to 600 nm) or from 20 to 40% (as an average of from 600 to 800 nm), and the difference of the absolute values between the maximum value and the minimum value of the haze (the maximum value–the minimum value) will be not more than 50%, such being preferred. The surface coverage can be adjusted by controlling the above-mentioned hydrogen chloride gas and the above-mentioned amount of water. As will be apparent from Examples given hereinafter, it is preferred to increase the proportion of hydrogen chloride gas to be added during formation of discontinuous small ridges made of the first oxide by the atmospheric pressure CVD method. The proportion of hydrogen chloride to be added is represented by the molar ratio of hydrogen chloride to tin tetrachloride (hereinafter referred to as $HCl/SnCl_4$), and $HCl/SnCl_4$ is preferably from 1.0 to 4.0. If $HCl/SnCl_4$ is within this range, small ridges can easily be formed, and the above-mentioned surface coverage can be controlled. It is particularly preferred that $HCl/SnCl_4$ is from 2.0 to 3.0.

The above first oxide will be described.

The above first oxide may be any oxide so long as it is highly transparent in a visible light region, and it may, for example, be $SnO_2$, $In_2O_3$, $ZnO$, $CdO$, $CdIn_2O_4$, $CdSnO_3$, $MgIn_2O_4$, $CdGa_2O_4$, $GaInO_3$, $InGaZnO_4$, $Cd_2Sb_2O_7$, $Cd_2GeO_4$, $CuAlO_2$, $CuGaO_2$, $SrCu_2O_2$, $TiO_2$ or $Al_2O_3$. Among them, it is preferred to employ at least one oxide selected from the group consisting of $SnO_2$, $ZnO$ and $In_2O_3$.

By forming such highly transparent small ridges on the above-mentioned transparent substrate and changing their heights, a desired roughness structure can be prepared on the transparent substrate.

The refractive index is preferably from 1.8 to 2.2, more preferably from 1.9 to 2.1 at a wavelength of from 400 to 800 nm.

Further, the small ridges made of the above first oxide are discontinuous protrusions and not a continuous film. Therefore, at the transparent substrate portions not covered by such protrusions, the absorption loss of incident light by small ridges is, of course, 0, and thus, the amount of incident light to the photoelectric conversion layer can be increased.

These small ridges are portions to increase the haze which will be described hereinafter (to increase the scattering degree of light) and preferably have no electrical conductivity in order to accomplish high transparency by suppressing absorption by free electrons. Accordingly, in a case where $SnO_2$ is used as the first oxide, it is preferred that the small ridges are made solely of $SnO_2$, or in a case where they contain fluorine, the fluorine content is preferably not more than 0.01 mol %, more preferably not more than 0.005 mol %, based on $SnO_2$.

Then, a continuous layer of a transparent conductive oxide being the second oxide is formed on the discontinuous small ridges made of the first oxide and on the flat glass substrate not covered by the small ridges, by means of an atmospheric pressure CVD method, an electron beam vapor deposition method, a vacuum vapor deposition method, a sputtering method or a spray method. To obtain a low resistance transparent conductive substrate, it is advisable to uniformly form a continuous layer (hereinafter referred to also as the second oxide layer) made of a transparent conductive oxide being the second oxide on the small ridges and also on the flat glass substrate not covered by the small ridges.

Further, if a normal CVD method is employed, the microroughness to be formed on the outer surface, can be formed without requiring an etching step. Accordingly, the transparent conductive oxide film as the second oxide layer is preferably formed by such an atmospheric pressure CVD method.

The second oxide layer will be described.

The second oxide is preferably a transparent conductive oxide which is transparent in a visible light region and which further has electrical conductivity, and it may, for example, be $SnO_2$, $In_2O_3$ or $ZnO$ containing a dopant to provide electrical conductivity. Among them, $SnO_2$ preferably contains fluorine or antimony as a dopant in an amount of from 0.01 to 4 mol % based on $SnO_2$. $ZnO$ preferably contains at least one member selected from the group consisting of B, Al and Ga, as a dopant, in an amount of from 0.02 to 5 mol % based on ZnO. $In_2O_3$ preferably contains Sn in an amount of from 0.02 to 4 mol % based on $In_2O_3$.

The refractive index is preferably from 1.8 to 2.2, more preferably from 1.9 to 2.1, at a wavelength of from 400 to 800 nm.

In a case where $SnO_2$ is used as the above second oxide in order to improve the electrical conductivity of the second oxide, it is preferred to have a halogen atom doped by a hydrogen halide. The hydrogen halide may, for example, be HF, HCl, HBr or HI, but fluorine-doped $SnO_2$ is preferred. Specifically, it is for example preferred to have fluorine incorporated in an amount of from 0.01 to 4 mol %, more preferably from 0.1 to 1 mol %, to $SnO_2$.

Further, the conductive electron density will be improved by using fluorine-doped $SnO_2$ as the above second oxide. As the substrate to be used for a solar cell, the conductive electron density may be preferably within a range of from $5\times10^{19}$ to $4\times10^{20}$ cm$^{-3}$, more preferably within a range of from $1\times10^{20}$ to $2\times10^{20}$ cm$^{-3}$. Within this range, the amount of light absorption of the film is small, and the film is highly transparent and has high durability against active hydrogen species, whereby the transparency will not be lost by hydrogen plasma irradiation commonly employed at the time of forming a thin film silicon-type solar cell which will be described hereinafter.

Here, the height $H_c$ of the small ridge made of the first oxide is preferably from 0.2 to 2.0 μm, more preferably from 0.2 to 1.0 μm, further preferably from 0.4 to 0.7 μm. The distance $W_c$ between the small ridges is linearly preferably from 0.1 to 2.0 μm, more preferably from 0.1 to 1.5 μm.

Further, the basal plane diameter $D_c$ of the small ridge is preferably from 0.2 to 2.0 μm, more preferably from 0.2 to 1.0 μm, and the pitch $P_c$ between the small ridges (the distance of the tops between the adjacent small ridges) is of the same value as $P_a$ and is linearly preferably from 0.1 to 2.0 μm, more preferably from 0.5 to 1.5 μm, further preferably from 0.7 to 1.2 μm.

The continuous layer 5 made of the second oxide is continuously formed on the above small ridges 4 and on the glass substrate 1 where no small ridges 4 are formed.

Further, as shown in FIG. 2, the surface of the continuous layer 5 has many micron-size protrusions 10 as mentioned above, and the thickness $H_d$ of the continuous layer 5 on the small ridges 4 (including the micron-size protrusions) is preferably from 0.5 to 1.0 μm, more preferably from 0.5 to 0.7 μm. Likewise, the thickness $H_e$ of the continuous layer 5 on the glass substrate 1 (including the micron-size protrusions) is preferably from 0.5 to 1.0 μm, more preferably from 0.5 to 0.7 μm.

The same oxide may be used for the first oxide and the second oxide, and it is preferred to use $SnO_2$ for each of them.

The method for producing small ridges made of the first oxide on the substrate is not particularly limited. For example, using a metal chloride as the starting material and heating the substrate, the oxide is formed by an atmospheric pressure CVD method, wherein a mixture of the metal chloride, a hydrogen halide and water, is used, whereby the metal element concentration in these media is adjusted. Specifically, the amounts of the hydrogen halide and water are adjusted to the metal chloride.

In order to form the second oxide layer on the small ridges of the first oxide as a continuous layer to obtain a transparent conductive oxide film having ridges and flat portions of the present invention, a thin oxide layer made of an oxide having a composition different from the first and second oxides, may be formed between the first and second oxides, whereby the production can be made easily and certainly.

Therefore, it is preferred that after forming a thin oxide layer (hereinafter referred to also as a different oxide layer) made of an oxide having a composition different from the first and second oxides on the surface of a flat glass substrate containing discontinuous small ridges made of the first oxide, the second oxide layer is deposited. By forming such a layer on the first oxide, many micron-size protrusions will be readily formed on the surface of the second oxide layer, whereby the structure having ridges and flat portions of the present invention can easily be formed.

In such a multilayer structure, it is necessary to reduce the reflection at the interfaces between the respective layers to maximize the amount of incident light to the photoelectric conversion layer of a solar cell which will be described hereinafter. Namely, it is desired to reduce reflection of light at the respective interfaces among the glass substrate, the first oxide, the different oxide layer and the second oxide layer as far as possible. For this purpose, it is desired that the refractive indices of the first oxide, the second oxide layer and the different oxide layer are close to one another as far as possible, and the film made of the different oxide layer is desired to be as thin as possible. Specifically, an oxide of at least one element selected from the group consisting of Si, Sn, Al, Zr and Ti may be mentioned, and among them, a layer containing an oxide of Si as the main component, is preferred.

Further, the different oxide layer is required to have high optical transmittance, and accordingly amorphous $SiO_2$ is more preferred. The film thickness is preferably from 2 to 40 nm, more preferably from 10 to 30 nm.

A method for forming the different oxide layer and the second oxide layer will be shown below. As the different oxide layer, a layer made of $SiO_2$ may, for example, be used. Using an atmospheric pressure CVD method, the layer made of $SiO_2$ is formed on the discontinuous small ridges made of the first oxide and on the flat glass substrate where no small ridges are formed.

Specifically, a glass substrate having small ridges made of the first oxide formed thereon, is heated to 520° C., and on this glass substrate, 4 L/min of nitrogen gas containing 5 mol % of silane gas and 3 L/min of oxygen gas are simultaneously blown to form a layer made of amorphous $SiO_2$ by an atmospheric pressure CVD method. Further, this glass substrate is heated to 540° C., and tin tetrachloride, water, hydrogen fluoride and methanol are simultaneously blown thereto, and an atmospheric pressure CVD method is employed to form a fluorine (F)-doped $SnO_2$ transparent conductive oxide film as the second oxide layer.

Further, the transparent conductive oxide as the second oxide may, for example, be F-doped $SnO_2$, antimony-doped $SnO_2$, Sn-doped $In_2O_3$ (ITO), aluminum-doped ZnO or gallium-doped ZnO.

In the substrate with a transparent conductive oxide film of the present invention, the first oxide is preferably one formed to improve the haze, and the second oxide is preferably an oxide having electrical conductivity and high transparency. Further, the refractive indices of the first oxide and the second oxide layer are preferably of an equal level and specifically at a level of from 1.8 to 2.2. If both the refractive indices of the first oxide and the second oxide are in this range, reflection of light at the interface between the first oxide and the second oxide will be controlled, whereby the optical transmittance will not decrease, such being desirable.

The first oxide is preferably one to improve the haze. Whereas, the second oxide layer formed as a continuous layer is preferably an oxide having electrical conductivity and high transparency.

The substrate with a transparent conductive oxide film of the present invention is constituted by a plurality of ridges having the above-described shape and a plurality of flat portions filling spacing between the ridges, and the surfaces of the ridges and the flat portions have many continuous micron-size protrusions. The height from the substrate surface to the top of the ridge (including the micron-size protrusions) is preferably from 0.8 to 3.0 µm, more preferably from 0.8 to 1.0 µm and the sheet resistance of the entire conductive film is preferably from 8 to 20Ω/□, more preferably from 8 to 12Ω/□. The optical transmittance (transparency) at 550 nm is preferably from 80 to 90%, more preferably from 85 to 90%, as measured by an immersion liquid method which will be described in detail in Examples given hereinafter. Further, as mentioned above, the haze is preferably from 10 to 95% over a full wavelength region of from 400 to 800 nm.

If the above-described construction is employed for a transparent electrode (the transparent conductive oxide film in the present invention) of a photoelectric conversion element such as a solar cell which will be described hereinafter, light entered through the substrate is refracted and scattered by the transparent electrode and then enters a photoelectric conversion section and passes over a long distance in the photoelectric conversion section. As a result, a large quantity of light will be absorbed at the photoelectric conversion section, whereby the photoelectric conversion efficiency will be improved.

Now, a preferred embodiment showing the construction of a photoelectric conversion element of the present invention (hereinafter described as a solar cell) comprising the above-described substrate with a transparent conductive oxide film, a photoelectric conversion layer and a rear face electrode, will be described with reference to FIG. 4. However, the substrate with a transparent conductive oxide film of the present invention, the solar cell and the processes for their production are not limited thereto.

Figure 4:
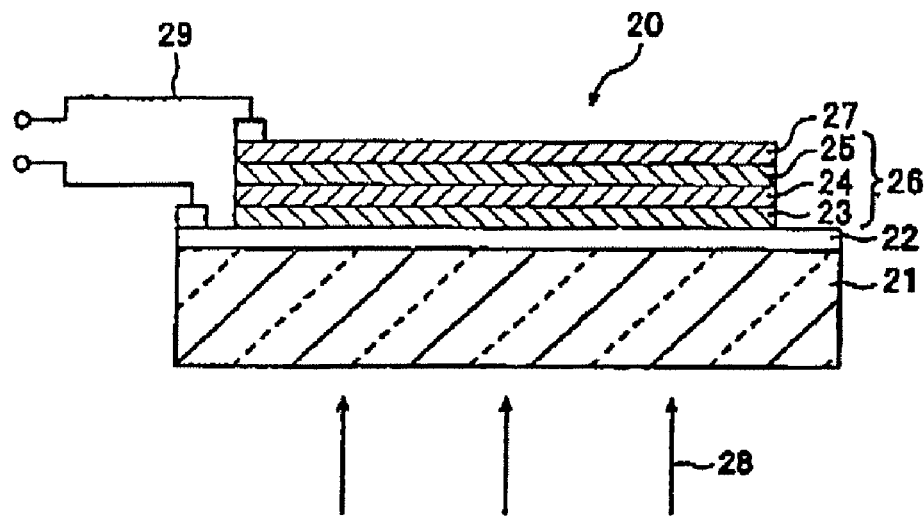
FIG. 4 is a partly omitted cross-sectional view showing the construction of a solar cell.

As shown in FIG. 4, the solar cell of the present invention is shown at 20 and has, on a glass substrate 21, a transparent conductive oxide film 22 to be used for the substrate with a transparent conductive oxide film of the present invention, a photoelectric conversion layer 26 and a rear face electrode 27. This construction is one of photoelectric conversion apparatus which can be produced at a relatively low cost. Such a solar cell 20 is designed so that light 28 enters from the glass substrate 21 side and is mainly absorbed within the i-type-layer 24. An electromotive force is generated between two electrodes i.e. the transparent conductive oxide film 22 and the rear face electrode 27, and the electricity will be taken out from the solar cell via a conductive wire 29.

Now, the respective constructions will be described.

The photoelectric conversion layer 26 may be any layer so long as it is a photoelectric conversion layer which can be used for a common solar cell. The structure of the photoelectric conversion layer 26 shown in FIG. 4 is a single junction comprising three layers wherein a p-type-layer 23, an i-type-layer 24 and an n-type-layer 25 are formed in this order. The material for the p-type-layer may, for example, be hydrogenated amorphous silicon carbide (a-SiC:H), and the material for the i-type-layer may, for example, be hydrogenated amorphous silicon (a-Si:H), crystalline silicon (c-Si), microcrystalline silicon (μc-Si), or hydrogenated amorphous silicon germanium (a-SiGe:H). Further, the material for the n-type-layer may, for example, be hydrogenated amorphous silicon (a-Si:H) or microcrystalline silicon (μc:Si).

Among them, preferred is a single junction of three layers wherein an a-SiC:H layer as the p-type-layer, an a-Si:H layer as the i-type-layer and an a-Si:H layer as the n-type-layer are formed in this order (hereinafter a p-i-n-type-layer of a-Si).

Further, as another example, an electric power generation layer of a tandem structure wherein on the p-i-n-type-layer of a-Si, a still another p-i-n-type-layer is formed, may, for example, be preferably used. More preferred is an electromotive layer of a tandem structure wherein the layer formed on the p-i-n-type-layer of a-Si is three layers wherein an a-Si:H layer as the p-type-layer, a microcrystalline Si layer as the i-type-layer and an a-Si:H layer as the n-type-layer are formed in this order, or three layers wherein an a-Si:H layer as the p-type-layer, an a-SiGe:H layer as the i-type-layer and an a-Si:H layer as the n-type-layer are formed in this order. By using the electromotive layer of a tandem structure for the photoelectric conversion layer, photoelectric conversion of light on not only the short wavelength side but also on the long wavelength side will be possible. Accordingly, if the electromotive layer having such a tandem structure is employed on the substrate with a transparent conductive oxide film of the present invention having the double texture structure, the effect for improving the photoelectric conversion efficiency will be more distinct.

Next, as the electrode material for the above back electrode layer 27, a layer containing Ag or an Ag alloy, or Al or an Al alloy, as the main component, may be used. Preferably, a metal film containing crystalline Ag in an amount of at least 95 mol % in the film, is employed. By using crystalline Ag for the metal film of the rear face electrode, it becomes possible that light passed through the photoelectric conversion layer 26 is reflected, and the reflected light can be returned again to the photoelectric conversion layer 26, thus leading to the effect for improving the photoelectric conversion efficiency.

The above metal film may contain Pd and/or Au as a component. The content of Pd and Au in the film is preferably from 0.3 to 5 mol % each, more preferably from 0.3 to 3 mol % each, based on the sum with Ag.

Further, in a case of a layer composed solely of Ag, the total amount of impurities is preferably not more than 1 mol %.

The solar cell of the present invention may have a contact-improving layer between the above back electrode layer 27 and the photoelectric conversion layer 26, as shown in FIG. 4. An embodiment of a substrate for a solar cell having the transparent conductive oxide film of the present invention and the contact-improving layer, will be described with reference to FIG. 5. However, the substrate with a transparent conductive oxide film of the present invention, the process for its production and the photoelectric conversion element, are not limited thereto.

Figure 5:
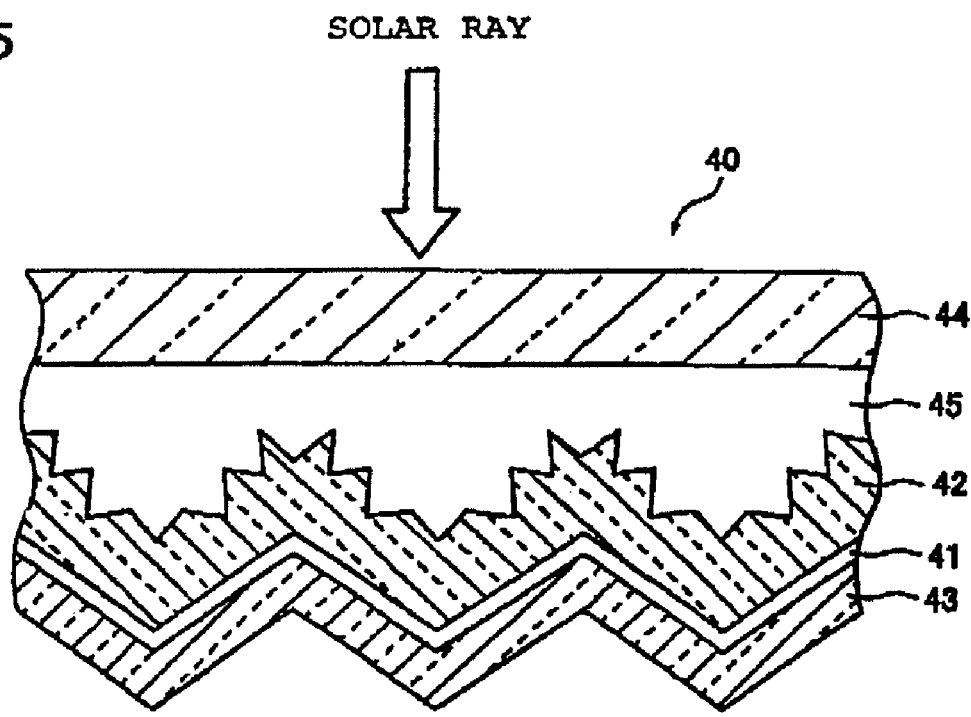
FIG. 5 is an enlarged view of the portion other than conductive wires, shown in FIG. 4.

As shown in FIG. 5, the substrate for a solar cell is shown at 40 and comprises a glass substrate 44, the transparent conductive oxide film 45 of the present invention, a photoelectric conversion layer 42 made of a p-i-n-type-layer of a-Si, a contact-improving layer 41 and a rear face electrode 43.

The contact-improving layer 41 is located between the above-mentioned p-i-n-type-layer of a-Si and the rear face electrode 43, as shown in FIG. 5, and is used to improve the contact of the photoelectric conversion layer represented by the p-i-n-type-layer of a-Si with the rear face electrode represented by the rear face electrode 43.

Further, the contact-improving layer 41 is preferably such that the resistivity and the absorption coefficient are small. Specifically, the resistivity is preferably at most $1 \times 10^{-2}$ Ω·cm, more preferably at most $5 \times 10^{-3}$ Ω·cm. If the resistivity of the above contact-improving layer 41 is within this range, it becomes possible to pass the electromotive force photoelectrically converted in the p-i-n-type-layer 42 of a-Si as the photoelectric conversion layer to the rear face electrode 43 as the rear face electrode without is reducing it.

The absorption coefficient is not more than $5 \times 10^3$ cm$^{-1}$, more preferably not more than $2 \times 10^3$ cm$^{-1}$ in a wavelength region of from 500 to 800 nm. If the absorption coefficient of the above contact-improving layer 41 is within this range, it becomes possible to pass the light passed through the p-i-n-type-layer 42 of a-Si as the photoelectric conversion layer to the rear face electrode 43 as the rear side electrode without absorption.

The material for the contact-improving layer 41 preferably contains zinc oxide (ZnO) as the main component, whereby at least 90 atomic % of the total metal component in the film is preferably Zn. More preferred is a layer having gallium (Ga) incorporated to the above layer containing zinc oxide as the main component, or a layer having aluminum (Al) incorporated thereto. By incorporating Ga or Al, the conductive electron density will be increased, and it serves as a dopant to zinc oxide, whereby it has an effect to improve the electroconductivity of the entire contact-improving layer 41.

Further, the content of Ga or Al is preferably from 0.3 to 10 mol %, more preferably from 0.3 to 5 mol %, based on the sum with Zn. If the content is within this range, it is possible to prevent an increase of the absorption coefficient of the contact-improving layer 41 due to an excessive improvement of the electroconductivity.

Further, the zinc oxide layer containing Ga or Al may contain impurities, and the total amount of impurities is preferably not more than 1 mol %.

The present invention provides a process for forming the above-mentioned solar cell by means of a plasma-enhanced CVD method or a sputtering method.

Specifically, a method for forming a photoelectric conversion layer on the substrate with a transparent conductive oxide film of the present invention, is the plasma-enhanced CVD method. Further, a method of forming the above-mentioned contact-improving layer and the above-mentioned rear face electrode on the above photoelectric conversion layer in this order, is the sputtering method.

The plasma-enhanced CVD method may be carried out under the conditions for forming a photoelectric conversion layer in a common solar cell, and for example, the p-i-n-type-layer of a-Si may be formed under the condition shown in Examples given hereinafter.

The sputtering method is a method for forming the above-mentioned contact-improving layer on the above photoelectric conversion layer. Specifically, it is a method for depositing a contact-improving layer on the photoelectric conversion layer by carrying out sputtering in an inert gas atmosphere using Ga-doped zinc oxide (hereinafter GZO) as a target.

Further, the method for forming the GZO layer is not particularly limited, and a physical vapor deposition method such as a sputtering method or a vacuum vapor deposition method, or a chemical vapor deposition method such as a CVD method may be employed. However, it is preferred to employ a physical vapor deposition method, whereby good conductive film characteristics can be obtained at a lower substrate temperature. In the following Examples, a DC sputtering method is employed, but this may be carried out by a high frequency sputtering method.

Likewise, a method for depositing a back electrode layer on the GZO layer as the contact-improving layer by carrying out sputtering in an inert gas atmosphere employing a metal containing at least 95 mol % of Ag (hereinafter referred to as a Ag type metal) as a target, is also a sputtering method.

The solar cell of the present invention may be prepared, for example, as follows. Firstly, a GZO target to form the contact-improving layer is attached to a cathode of a DC magnetron sputtering equipment. Further, the substrate with a transparent conductive oxide film having a photoelectric conversion layer formed, is attached to the substrate holder. Then, the interior of the film-forming chamber is evacuated to vacuum, and then, argon gas is introduced as sputtering gas. As the sputtering gas, other than the argon gas, an inert gas such as He, Ne or Kr may be employed. However, it is preferred to use argon gas which is inexpensive and whereby the discharge is stable. Further, it is more preferably an inert gas containing carbon dioxide in an amount of from 0.3 to 20 vol %, still more preferably from 0.3 to 10 vol %. By incorporating carbon dioxide, it is possible to prevent an increase of the absorption coefficient due to an excessive improvement of the electrical conductivity by Ga doping.

The pressure during the sputtering is usually from 0.1 to 1.5 Pa. Further, the residual gas pressure is preferably from $1\times10^{-5}$ to $2.5\times10^{-3}$ Pa. The substrate temperature is usually from room temperature to 200° C., particularly from 100 to 150° C., from the viewpoint of the characteristics of the solar cell.

Further, for the above film forming by sputtering, it is preferred to carry out sputtering by having the GZO target inclined at an angle of from 30 to 90° to the substrate (hereinafter referred to as inclined sputtering), whereby low resistance and low absorption can be accomplished simultaneously.

For the formation of the back electrode layer, in the same manner as for the contact-improving layer, firstly, a Ag type metal target to form the back electrode layer, is attached to a cathode of the DC magnetron sputtering equipment. Further, as mentioned above, substrate having the contact-improving layer formed thereon, is attached to the substrate holder. Then, the interior of the film-forming chamber is evacuated to vacuum, and then, argon gas is introduced as sputtering gas. As the sputtering gas, other than the argon gas, an inert gas such as He, Ne or Kr may be employed. However, it is preferred to use argon gas which is inexpensive and whereby discharge will be stable.

The pressure during the sputtering is also similar and is usually from 0.1 to 1.5 Pa. Further, the residual gas pressure is preferably from $1.0\times10^{-5}$ to $2.5\times10^{-3}$ Pa. The temperature of the substrate during the sputtering is usually from room temperature to 200° C., particularly from 100° C. to 150° C., from the viewpoint of the adhesion between the substrate and the film. It is preferred to heat the substrate during the sputtering, whereby improvement of crystallinity of Ag as the rear face electrode, improvement in the reflectance and reduction of the resistance of the entire substrate can be obtained.

Further, when a Ag layer containing Pd and/or Au is formed as the back electrode layer, separate targets may be used for Pd and/or Au, or an Ag alloy containing Pd and/or Au having a desired composition, may be preliminarily prepared, and such an alloy may be used as the target.

The respective film thicknesses of the photoelectric conversion layer, the contact-improving layer and the back electrode layer, formed by the above plasma-enhanced CVD method and the above sputtering method, will be shown below.

As mentioned above, when the photoelectric conversion layer is a tandem structure having a separate p-i-n-type-layer formed on the p-i-n-type-layer of a-Si, it may have a tandem structure wherein the layer to be formed on the p-i-n-type-layer of a-Si is three layers wherein an a-Si:H layer as the p-type-layer, a microcrystalline Si layer as the i-type-layer and an a-Si:H layer as the n-type-layer, are formed in this order or three layers wherein an a-Si:H layer as the p-type-layer, an a-SiGe:H layer as the i-type-layer and an a-Si:H layer as the n-type-layer, are formed in this order. Accordingly, the film thickness of the photoelectric conversion layer varies depending upon the type of the electromotive layer to be formed. The thickness of the p-type-layer or the n-type-layer formed by the plasma-enhanced CVD method is within a range of from 5 to 15 nm, and the thickness of the i-type-layer is from 100 to 400 nm. Further, the thickness of the microcrystalline Si layer in the tandem structure is from 500 to 3000 nm.

The thickness of the contact-improving layer formed by the sputtering method is preferably from 50 to 200 nm, more preferably from 50 to 150 nm. When the contact-improving layer is a GZO layer, the film thickness is preferably from 50 to 150 nm. If the thickness of the contact-improving layer is within this range, an adequate effect for improving the contact can be obtained also for the double texture structure like the substrate with a transparent conductive oxide film of the present invention.

Further, the thickness of the back electrode layer is preferably from 100 to 300 nm, more preferably from 150 to 250 nm. Especially when the back electrode layer is Ag, the thickness is preferably from 150 to 250 nm.

EXAMPLES

A substrate with a transparent conductive oxide film of the present invention having a double texture structure was prepared under the conditions as identified in the following Examples.

(1) Production Example 1

Formation of First Oxide a) Example

A substrate with a transparent conductive oxide film was prepared by an atmospheric pressure CVD method on a soda lime glass substrate. A soda lime glass substrate of 300 mm×300 mm×1.1 mm in thickness was heated to 500° C. in a belt conveyor furnace (speed of the belt: 1 m/min), and firstly, 4 L/min of nitrogen gas containing 5 mol % of silane gas and 20 L/min of oxygen gas were blown thereto simultaneously to form a silica film. Then, the glass substrate with this silica film was heated to 540° C., and tin tetrachloride, water and hydrogen chloride gas were simultaneously blown thereto to form $SnO_2$ as the first oxide. Tin tetrachloride was preliminarily heated to 45° C. and transferred onto the substrate by blowing nitrogen gas at a rate of 2 L/min. Further, water heated to 100° C. was blown at a rate of 15 g/min, and hydrogen chloride gas was blown at a rate of 0.5 L/min to the substrate.

After the film formation, the surface morphology of the film was observed by SEM, whereby $SnO_2$ as the first oxide was found to be not a continuous film but form small ridges being macro-sized roughness. A SEM image of the substrate as observed from directly above, was image-processed and calculated, whereby the coverage of the glass substrate surface by $SnO_2$ forming the small ridges, was 60%, the heights $H_c$ of the small ridges made of $SnO_2$ were from 0.4 to 0.6 μm, the basal plane diameters $D_c$ of the small ridges made of $SnO_2$ were from 0.5 to 0.7 μm, the distances $W_c$ between the adjacent small ridges were from 0.2 to 0.5 μm, and the pitches $P_c$ between the adjacent small ridges were from 0.7 to 1.2 μm. Further, by the measuring methods which will be described hereinafter, the sheet resistance of the small ridges made of the first oxide was found to be at least 20 MΩ/□, the haze was found to be 55% (as an average of from 400 to 600 nm), or 70% (as an average of from 600 to 800 nm), and the optical transmittance at 550 nm measured by an immersion liquid method was 88%.

b) REFERENCE EXAMPLE

In the same manner as in the above Example, a soda lime glass substrate of 300 mm×300 mm×1.1 mm in thickness, was heated to 500° C. in a belt conveyor furnace (speed of the belt: 1 m/min), and firstly, 4 L/min of nitrogen gas containing 5 mol % of silane gas and 20 L/min of oxygen gas were simultaneously blown thereto to form a silica film. Then, the glass substrate with this silica film, was heated to 540° C., and tin tetrachloride, water and hydrogen chloride gas were blown thereto in the proportions as identified below, to form $SnO_2$ as the first oxide. Here, tin tetrachloride was preliminarily heated to 45° C. and transferred onto the substrate by blowing nitrogen gas at a rate of 2 L/min. Whereas, water heated to 100° C. was blown at a rate of 15 g/min and hydrogen chloride gas was blown at a rate of from 0 to 0.6 L/min to the substrate. FIGS. 3a to 3d are electron microscopic photographs.

Figure 3:
FIG. 3 is electron microscopic photographs showing the shapes of small ridges formed by using hydrogen chloride gas, and a, b, c and d represent production examples under different conditions, respectively.

Firstly, in the case where hydrogen chloride was not added, the shape of small ridges became the shape as shown in FIG. 3d (the height of the small ridges: 300 nm), the surface coverage was 96%, and the haze of the entire transparent electrode finally obtainable was about 20% (as an average of from 400 to 800 nm). Whereas, in the case where the molar ratio of hydrogen chloride to tin tetrachloride ($HCl/SnCl_4$) was 1.1, the shape of the small ridges became the shape shown in FIG. 3c (the height of the small ridges: 390 nm), the surface coverage was 80%, and the haze of the entire transparent electrode finally obtainable was about 30% (as an average of from 400 to 800 nm). Likewise, in the case where $HCl/SnCl_4$ was 2.2, the shape of the small ridges became the shape as shown in FIG. 3b (height of the small ridges; 570 nm), the surface coverage was 53%, and the haze of the entire transparent electrode finally obtainable was about 60% (as an average of from 400 to 800 nm). In a case where $HCl/SnCl_4$ was 3.3, the shape of the small ridges became the shape as shown in FIG. 3a (height of the small ridges: 730 nm), the surface coverage was 47%, and the haze of the entire transparent electrode finally obtainable was about 70% (as an average of from 400 to 800 nm).

Formation of Second Oxide Layer a) Example

Then, on the small ridges made of $SnO_2$ obtained in the previous Example, an amorphous $SiO_2$ film as a different oxide layer was formed by means of an atmospheric pressure CVD method. The glass temperature was 520° C., the amount of the nitrogen gas containing 5 mol % of silane gas was 0.6 L/min, and the amount of the oxygen gas was 3 L/min. Further, this substrate was heated to 540° C., and tin tetrachloride, water, HF gas and methanol were blown thereto to form a F-doped $SnO_2$ film as a second oxide layer. The tin tetrachloride was preliminarily heated to 45° C. and transferred onto the substrate by blowing nitrogen gas at a rate of 12 L/min. Whereas, water heated to 100° C. was blown at a rate of 90 g/min, and the HF gas was blown at a rate of 3 L/min to the substrate. Further, to the methanol preliminarily heated to 30° C., nitrogen gas was blown at a rate of 0.1 L/min, and the mixture was blown to the substrate.

The surface morphology of the film was observed by SEM and AFM. According to the SEM observation, the F-doped $SnO_2$ film as the second oxide layer was found to be continuous layer, and the coverage of the glass substrate surface by the F-doped $SnO_2$ film was 100%. According to the SEM and AFM observation, the heights $H_a$ of the ridges were from 0.4 to 0.6 μm, the distances $W_a$ between the adjacent ridges were from 0 to 0.4 μm, the basal plane diameters $D_a$ of the ridges were from 1.0 to 1.5 μm, the pitches $P_a$ between the adjacent ridges were from 0.3 to 1.2 μm, and the heights from the substrate surface to the tops of the ridges (including micron-size protrusions) were from 0.8 to 1.0 μm. Further, the surface of the F-doped $SnO_2$ film had many micron-sized roughness, and the heights $H_b$ of the protrusions were from 0.1 to 0.2 μm, the pitches $P_b$ between the protrusions were from 0.1 to 0.2 μm, the basal plane diameters $D_b$ of the protrusions were from 0.2 to 0.3 μm, and the height $H_b$/basal plane diameter $D_b$ of the protrusions was 0.73. Further, from the measuring methods which will be described hereinafter, the sheet resistance was found to be 10Ω/□, the haze was found to be 65% (as an average of from 400 to 600 nm) or 30% (as an average of from 600 to 800 nm), and the optical transmittance at 550 nm measured by an immersion liquid method was 87%.

In order to quantitatively analyze the conductive electron density and the fluorine content in the F-doped $SnO_2$ film as the second oxide layer, tin tetrachloride, water, HF gas and methanol were blown onto a glass substrate having silica preliminarily coated, to form a F-doped $SnO_2$ film. With respect to the substrate temperature and the gas flow rates, the same manner as the conditions for preparing the second oxide layer in this Example were used. The obtained F-doped $SnO_2$ film was dissolved in hydrochloric acid containing zinc, followed by quantitative analysis by gas chromatography, whereby the fluorine content was 0.05 mol % based on $SnO_2$. Further, the electron density was obtained by measurement by the Hall effect (van der Pauw method) and found to be $1.5 \times 10^{20}$ cm$^{-3}$. Further, the thickness of the F-doped $SnO_2$ film was 0.6 μm as measured by a contact type film thickness meter.

(2) Production Example 2

For the formation of the first oxide, a silica film was prepared under the same manner as in Production Example 1, and then, the glass substrate with the silica film was heated to 540° C., and tin tetrachloride, water, and hydrogen chloride gas were simultaneously blown is thereto to form $SnO_2$ as the first oxide. The tin tetrachloride was preliminarily heated to 45° C. and transferred onto the substrate by blowing nitrogen gas at a rate of 4 L/min. Whereas, water heated to 100° C. was blown at a rate of 30 g/min, and the hydrogen chloride gas was blown at a rate of 1.0 L/min to the substrate. Formation of the second oxide layer was carried out under the same manner as in Production Example 1.

The roughness of the surface of the obtained film was observed by SEM and AFM. According to the SEM observation, like the film obtained in Example of Production Example 1, the F-doped $SnO_2$ film as the second oxide layer was a continuous layer, and the coverage of the glass substrate surface by the F-doped $SnO_2$ film was 100%. According to the SEM and AFM observation, the heights $H_a$ of the ridges were from 0.8 to 1.2 μm, the distances $W_a$ between the adjacent ridges were from 0 to 0.6 μm, the basal plane diameters $D_a$ of the ridges were from 1.2 to 1.8 μm, the pitches $P_a$ between the adjacent ridges were from 0.6 to 2.0 μm, and the heights from the substrate surface to the tops of the ridges (including micron-size protrusions) were from 1.4 to 1.8 μm. Further, the surface of the F-doped $SnO_2$ film had many micron-size irregularities, the heights $H_b$ of the protrusions were from 0.1 to 0.2 μm, the pitches $P_b$ between the protrusions were from 0.1 to 0.2 μm, the basal plane diameters $D_b$ of the protrusions were from 0.2 to 0.3 μm, and the height $H_b$/basal plane diameter $D_b$ of the protrusions was 0.73. Further, by the measuring methods which will be described hereinafter, the sheet resistance was found to be 11Ω/□, and the haze was found to be 82% (as an average of from 400 to 600 nm) or 62% (as an average of from 600 to 800 nm), and the optical transmittance at 550 nm measured by an immersion liquid method was 86%.

Figure 6:
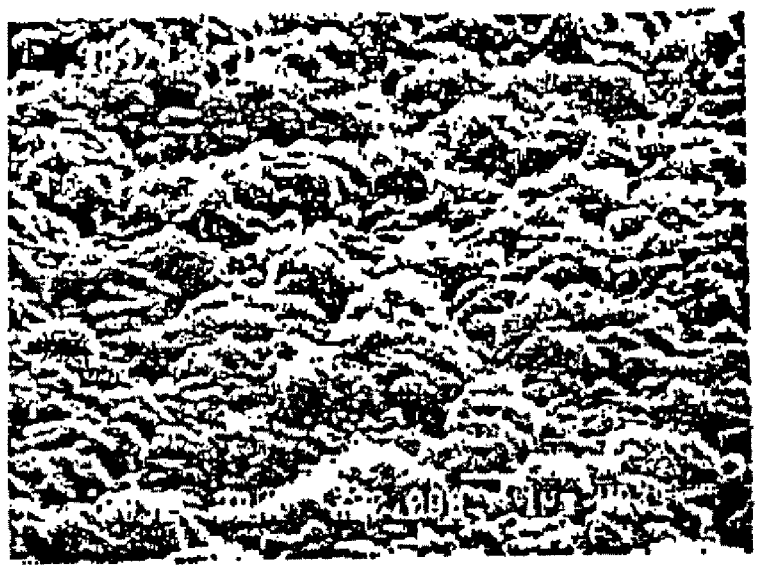
FIG. 6A and FIG. 6B are electron microscopic photographs showing the surface morphology of the film obtained in an Example of Production Example 1.
Figure 6:
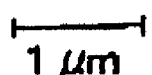
Figure 6:
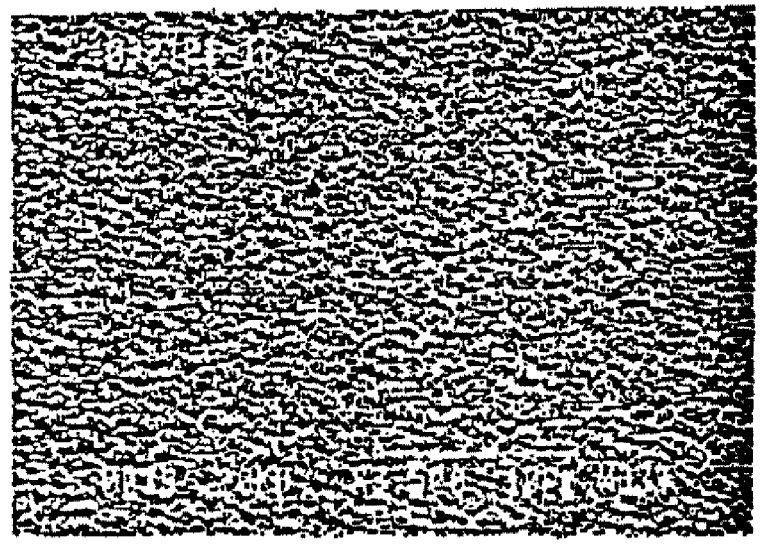
Figure 6:
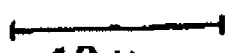
Figure 7:
FIG. 7A and FIG. 7B are electron microscopic photographs showing the surface morphology of the film obtained in Production Example 2.
Figure 7:
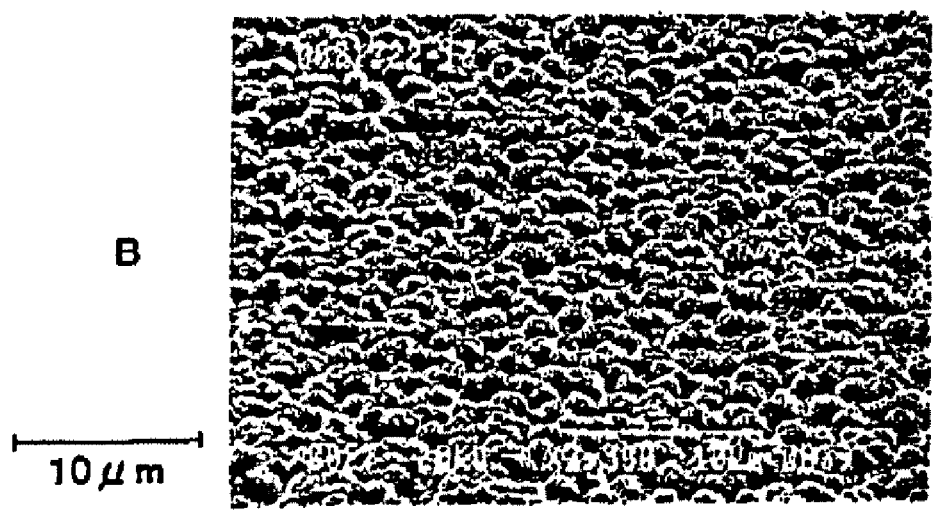

Electron microscopic photographs of the film obtained in Example of the above Production Example 1 and the film obtained in Production Example 2 are shown in FIGS. 6 and 7, respectively. FIG. 6A and FIG. 6B are electron microscopic photographs showing the surface morphology of the film shown by 20000 magnifications and 3500 magnifications, respectively. Likewise, FIG. 7A and FIG. 7B are electron microscopic photographs showing the surface morphology of the film shown by 20000 magnifications and 3500 magnifications, respectively. From these photographs, it was found that the substrate with a transparent conductive oxide film of the present invention having a transparent conductive oxide film formed on a substrate has a double texture structure.

Now, the methods for measuring the sheet resistance, the haze and the optical transmittance of the obtained substrate with a film, will be described. The sheet resistance was measured by a four terminal method. A square of about 3 cm×3 cm was cut out from the substrate with a conductive oxide film, and a pair of electrodes having a length of 3 cm were attached at the opposing two sides in parallel on the film so that the distance between the electrodes would be 3 cm. Then, the resistance between the electrodes was measured by a tester and taken as the sheet resistance. The haze was measured by means of a spectro-photometer (U3400, manufactured by Hitachi, Ltd.). The measured wavelength range was from 400 to 800 nm, the measured distance was 10 nm. Firstly, by setting the incident light surface to be the glass surface, the optical transmittance was measured by a normal transmission method. The optical transmittance at each wavelength is designated as $Td(\lambda)$. Then, an integrating sphere having an inner sphere diameter of 150 mm was mounted, and the film surface of the sample was closely contacted to the integrating sphere, and the integrating sphere optical transmittance was measured. The optical transmittance at each wavelength at that time is designated as $Tt(\lambda)$. From the foregoing measurement results, the haze $Hz(\lambda)$ was calculated by the following formula.

$$Hz(\lambda) = (Tt(\lambda) - Td(\lambda)) \times 100 / Tt(\lambda) \; (\%)$$

The spectral transmittance was measured by means of an immersion liquid method to minimize the measurement error due to the difference in the surface roughness of the conductive oxide substrate. The immersion liquid method is a method wherein a few drops of diiodomethane was dropped on the film surface of the substrate with the conductive oxide film, and the optical transmittance is measured by sandwiching the solution by a transparent quartz glass. The absorption by diiodomethane is mainly at most 400 nm. Accordingly, within a range of from 400 to 800 nm, there will be no substantial absorption by the diiodomethane and the quartz glass. The measurement of the spectral transmittance was carried out by mounting an integrating sphere having an inner sphere diameter of 150 mm (150-0901, manufactured by Hitachi, Ltd.) on a spectro-photometer (U3400, manufactured by Hitachi, Ltd.).

b) COMPARATIVE EXAMPLE

Figure 8:
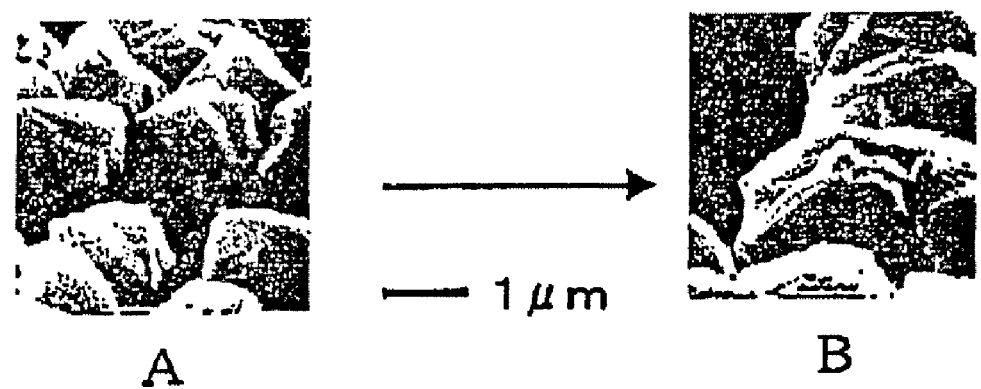
FIG. 8 is electron microscopic photographs showing small ridges, wherein A shows the first oxide layer, and B shows the second oxide layer formed thereon.

An example is shown wherein when the second oxide layer was formed without forming a different oxide layer, the small ridges were enlarged, and a continuous layer was not formed. FIGS. 8A and B are electron microscopic photographs when on the first oxide (FIG. 8A), the second oxide layer was formed (FIG. 8B).

Firstly, a soda lime glass substrate of 300 mm×300 mm×1.1 mm in thickness was heated to 500° C. in a belt conveyor furnace (speed of the belt: 1 m/min), and firstly, 4 L/min of nitrogen gas containing 5 mol % of silane gas and 20 L/min of oxygen gas were simultaneously blown thereto to form a silica film. For a $SnO_2$ film as the first oxide, this glass substrate with the silica film was heated to 540° C., and then tin tetrachloride, water and hydrogen chloride gas were simultaneously blown thereto to form $SnO_2$ as the first oxide. The tin tetrachloride was preliminarily heated to 45° C. and transferred onto the substrate by blowing nitrogen gas at a rate of 2 L/min. Whereas, water heated to 100° C. was blown at a rate of 15 g/min, and the hydrogen chloride gas was blown at a rate of 0.5 L/min to the substrate.

Then, the F-doped $SnO_2$ film as the second oxide layer was formed by heating this substrate to 540° C., followed by blowing tin tetrachloride, water, HF gas and methanol thereto. Table tin tetrachloride was preliminarily heated to 45° C. and transferred onto the substrate by blowing nitrogen gas at a rate of 12 L/min. Whereas, water heated to 100° C. was blown at a rate of 90 g/min, and the HF gas was blown at a rate of 3 L/min to the substrate. Further, 0.1 L/min of nitrogen gas was blown to methanol preliminarily heated to 30° C., and the mixture was blown to the substrate. However, in the case where a different oxide layer was not formed, even if it was attempted to form the second oxide layer under the same manner as in the case where the different oxide layer was formed, the obtained shape was such that small ridges made of the first oxide were enlarged, as shown by the electron microscopic photographs of Table 8B.

Then, a solar cell of the present invention was produced under the following conditions.

Formation of Photoelectric Conversion Layer

Then, the substrate with the transparent conductive oxide film obtained in Example of Production Example 1 was cut into a size of 40 mm×40 mm, and a photoelectric conversion layer having p-i-n junction was laminated on the transparent conductive oxide film by a plasma-enhanced CVD equipment (SLCM14, manufactured by Shimadzu Corporation). Table p-i-n junction is one wherein the p-type-layer, the i-type-layer and the n-type-layer are formed (joined) in this order. Table film-forming conditions for the p-type-layer, the i-type-layer, the n-type-layer and the p/i buffer layer used in this test were shown in Table 1, 2, 3 and 4, respectively.

Formation of Contact-Improving Layer and Back Electrode Layer

Then, on the photoelectric conversion layer, a GZO layer was formed in a thickness of about 100 nm by a DC sputtering method by inclining a GZO target containing 5 mol % of Ga based on the sum with zinc at an angle of 60° to the substrate. The sputtering was carried out by preliminarily evacuating the vacuum apparatus to a reduced pressure of at most $10^{-4}$ Pa and then introducing 75 sccm of Ar gas and 1 sccm of $CO_2$ gas, whereby the pressure during the sputtering was adjusted to be $4\times10^{-1}$ Pa, and the sputtering power was adjusted to be 2.4 W/cm². Further, the Ga content in the GZO film was 5 mol % based on the sum with zinc in the same content as in the target, and the substrate temperature was adjusted to be 100° C. The performance of the GZO single film was such that the resistivity was $5\times10^{-3}$ Ω·cm, and the absorption coefficient was $1\times10^3$ cm$^{-1}$ at from 500 to 800 µm. Finally, a Ag film as the back electrode layer was formed in a thickness of about 200 nm on the GZO film by a sputtering method in an Ar gas atmosphere using a Ag target (the pressure during the sputtering: $4\times10^{-1}$ Pa, sputtering power: 1.4 W/cm²), and finally a solar cell having a size of 5 mm×5 mm was prepared.

To the solar cell thus obtained, light of AM (airmass) of 1.5 was irradiated by a solar simulator, whereby the photoelectric conversion efficiency was obtained from the results of measuring the short circuit current, the open circuit voltage and the fill factor. Table thicknesses of the respective layers of the solar cell were as shown in the following Table 5. For the measurement of the solar cell characteristics (IV characteristic, spectral response), CD-24 model solar simulator, manufactured by OPHTHO RESEARCH was employed. The irradiated light spectrum of the solar simulator at the time of IV measurement was adjusted so that AM was 1.5, the light intensity was 100 mA/cm², As a result, the short circuit current was 18.7 mA/cm², the open circuit voltage was 0.81 V, the fill factor was 0.71, and the conversion efficiency was 10.8%.

Then, using the substrate with the transparent conductive oxide film obtained in Example of Production Example 2, a photoelectric conversion layer was formed by the same method as in Production Example 1, to obtain a solar cell.

With respect to the solar cell obtained by the above method, the solar cell characteristics were obtained in the same manner as in the Production Example 1, whereby the short circuit current was 19.3 mA/cm², the open circuit voltage was 0.81 V, the fill factor was 0.71, and the conversion efficiency was 11.1%.

Further, using the substrate with the transparent conductive oxide film obtained in Comparative Example, a photoelectric conversion layer was formed in the same manner as in Production Example 1 to obtain a solar cell. However, the solar cell obtained by the above method did not function as a solar cell.

TABLE 1

Deposition condition of p-type-layer

| | | |
|---|---|---|
| Substrate surface temperature | | 180° C. |
| Pressure | | 40 Pa |
| RF power | | 0.03 W/cm² |
| Gas flow rate | SIH$_4$ | 10 sccm |
| | CH$_4$ | 20 sccm |
| | H$_2$ | 20 sccm |
| | H$_2$/B$_2$H$_6$ | 100 sccm |

(B$_2$H$_6$: 1000 ppm)

TABLE 2

Deposition condition of i-type-layer

| | |
|---|---|
| Substrate surface temperature | 180° C. |
| Pressure | 27 Pa |
| RF power | 0.03 W/cm² |
| Gas flow rate SiH$_4$ | 10 sccm |

TABLE 3

Deposition condition of n-type-layer

| | | |
|---|---|---|
| Substrate surface temperature | | 180° C. |
| Pressure | | 40 Pa |
| RF power | | 0.03 W/cm² |
| Gas flow rate | SiH$_4$ | 10 sccm |
| | H$_2$ | 100 sccm |
| | H$_2$/PH$_3$ | 100 sccm |

(PH$_3$: 1000 ppm)

TABLE 4

Deposition condition of p/i buffer layer

| | | |
|---|---|---|
| Substrate surface temperature | | 180° C. |
| Pressure | | 27 Pa |
| RF power | | 0.03 W/cm² |
| Gas flow rate | SiH$_4$ | 10 sccm |
| | CH$_4$ | 0 to 20 sccm |
| | H$_2$ | 20 sccm |

TABLE 5

| | |
|---|---|
| Thickness of p-type-layer | 10 nm |
| Thickness of p-SiC buffer layer | 8 nm |
| Thickness of i-type-layer | 350 nm |
| Thickness of n-type-layer | 40 nm |
| Thickness of GZO layer | 10 nm |
| Thickness of Ag layer | 200 nm |

INDUSTRIAL APPLICABILITY

The substrate with a transparent conductive oxide film having a double texture structure, obtained by the present invention, has low resistance and high transparency and is excellent in mass productivity, and it has good light scattering performance over a full wavelength region of solar ray (from 300 nm to 3 µm). Further, according to the process of the present invention, such a substrate can be obtained with good productivity. If this substrate is used as a substrate for a thin film silicon type photoelectric conversion element, it is possible to obtain a photoelectric conversion element (especially a solar cell) excellent in the photoelectric conversion efficiency.

The entire disclosure of Japanese Patent Application No. 2001-322552 filed on Oct. 19, 2001 including specification, claims, drawings and summary is incorporated herein by reference in its entirety.

What is claimed is:

1. A substrate with a transparent conductive oxide film, comprising:

a substrate having a smooth surface; and a transparent conductive oxide film provided on the substrate, wherein the transparent conductive oxide film comprises a plurality of discontinuous ridges made of a first oxide having a refractive index of from 1.8 to 2.2 in the wavelength range of from 400 to 800 nm and a continuous layer made of a second oxide formed over the discontinuous ridges and between the discontinuous ridges, and said continuous layer has a continuous series of micron-size protrusions over each of the discontinuous ridges and between each of the discontinuous ridges.

2. A substrate with a transparent conductive oxide film, comprising:
a substrate having a smooth surface; and
a transparent conductive oxide film provided on the substrate,
wherein the transparent conductive oxide film comprises a plurality of discontinuous ridges made of a first oxide having a refractive index of from 1.8 to 2.2 in the wavelength range of from 400 to 800 nm and a continuous layer made of a second oxide formed on the discontinuous ridges and between the discontinuous ridges, and the transparent conductive oxide film further includes a film made of an oxide different than the first and second oxides and formed between the plurality of discontinuous ridges made of the first oxide and the continuous layer made of the second oxide.

3. The substrate with a transparent conductive oxide film according to claim 2, wherein the plurality of discontinuous ridges has a height in a range from 0.2 to 2.0 µm.

4. The substrate with a transparent conductive oxide film according to claim 2, wherein the film made of an oxide different than the first and second oxides is made of a $SiO_2$ and has a thickness of from 2 to 40 nm.

5. The substrate with a transparent conductive oxide film according to claim 4, wherein the thickness of the film made of an oxide different than the first and second oxides is from 10 to 30 nm.

6. The substrate with a transparent conductive oxide film according to claim 3, wherein the height of the discontinuous ridges is from 0.2 to 1.0 µm.

7. The substrate with a transparent conductive oxide film according to claim 3, wherein the height of the discontinuous ridges is from 0.4 to 0.7 µm.

8. The substrate with a transparent conductive oxide film according to claim 2, wherein the continuous layer has a continuous series of micron-size protrusions, and a pitch between the micron-size protrusions is from 0.1 to 0.3 µm.

9. The substrate with a transparent conductive oxide film according to claim 2, wherein the transparent conductive oxide film has a plurality of flat portions between the discontinuous ridges, and the plurality of discontinuous ridges has a height of from 0.2 to 2.0 µm.

10. A substrate with a transparent conductive oxide film, comprising:
a substrate having a smooth surface; and
a transparent conductive oxide film provided on the substrate,
wherein the transparent conductive oxide film comprises a plurality of discontinuous ridges made of a first oxide and a continuous layer made of a second oxide formed over the discontinuous ridges and between the discontinuous ridges, a total coverage of the discontinuous ridges on the substrate is from 10 to 70% of the substrate surface area, and the continuous layer has a plurality of continuous micron-size protrusions over each of the discontinuous ridges and between each of the discontinuous ridges.

11. A substrate with a transparent conductive oxide film, comprising:
a substrate having a smooth surface; and
a transparent conductive oxide film provided on the substrate and comprising a plurality of discontinuous ridges made of a first oxide and a continuous layer made of a second oxide formed on the plurality of discontinuous ridges of the first oxide,
wherein the transparent conductive oxide film further includes a film made of an oxide different than the first and second oxides and formed between the plurality of discontinuous ridges made of first oxide and the continuous layer made of a second oxide, and the ratio (Ha/Da) of the height of the ridge (Ha) to the basal plane diameter of the ridge (Da) is from 0.27 to 1.00.

12. A substrate with a transparent conductive oxide film, comprising;
a substrate having a smooth surface; and
a transparent conductive oxide film provided on the substrate,
wherein the transparent conductive oxide film comprises a plurality of discontinuous ridges made of first oxide and continuous layer made of a second oxide formed on the discontinuous ridges, the transparent conductive oxide film further includes a film made of an oxide different than the first and second oxides and formed between the plurality of discontinuous ridges made of first oxide and the continuous layer made of a second oxide, and the substrate with the transparent conductive oxide film has a haze of from 65 to 82% as an average of from 400 to 600 nm and of from 30 to 62% as an average of from 600 to 800 nm.

13. A substrate with a transparent conductive oxide film, comprising:
a substrate having a smooth surface; and
a transparent conductive oxide film provided on the substrate,
wherein the transparent conductive oxide film comprises a plurality of discontinuous ridges made of first oxide and a continuous layer made of a second oxide containing a dopant to provide electrical conductivity formed on the discontinuous ridges, and the transparent conductive oxide film further includes a film made of an oxide different than the first and second oxides and formed between the plurality of discontinuous ridges made of first oxide and the continuous layer made of a second oxide.

* * * * *